(12) United States Patent
Garman et al.

(10) Patent No.: US 9,111,436 B2
(45) Date of Patent: Aug. 18, 2015

(54) SYSTEMS AND METHODS OF EMBEDDING A RADIO TRANSCEIVER INTO AN ENERGY STORAGE DEVICE USED IN ELECTRONIC EQUIPMENT

(75) Inventors: Christopher J. Garman, Morgantown, WV (US); Douglas W. Shrewsberry, Morgantown, WV (US); David B. Kaplin, Fairmont, WV (US); Jason A. Bell, Bridgeport, WV (US); Thomas J. Bonazza, Fairmont, WV (US)

(73) Assignee: Electronic Warfare Associates, Inc., Herndon, VA (US)

( * ) Notice: Subject to any disclaimer, the term of this patent is extended or adjusted under 35 U.S.C. 154(b) by 51 days.

(21) Appl. No.: 13/534,006

(22) Filed: Jun. 27, 2012

(65) Prior Publication Data

US 2013/0093567 A1      Apr. 18, 2013

Related U.S. Application Data

(60) Provisional application No. 61/503,427, filed on Jun. 30, 2011.

(51) Int. Cl.
| | |
|---|---|
| G08B 5/22 | (2006.01) |
| G08B 25/00 | (2006.01) |
| G08C 19/00 | (2006.01) |
| H05K 13/00 | (2006.01) |
| H01P 11/00 | (2006.01) |
| H01Q 1/24 | (2006.01) |

(52) U.S. Cl.
CPC ............. *G08C 19/00* (2013.01); *H01P 11/00* (2013.01); *H01Q 1/24* (2013.01); *H05K 13/0046* (2013.01); *Y10T 29/49002* (2015.01); *Y10T 29/49016* (2015.01)

(58) Field of Classification Search
None
See application file for complete search history.

(56) References Cited

U.S. PATENT DOCUMENTS

| | | | |
|---|---|---|---|
| 4,593,409 A | 6/1986 | Miller | |
| 6,480,149 B1 | 11/2002 | Sutherland | |
| 6,674,364 B1 * | 1/2004 | Holbrook et al. | 340/568.1 |
| 7,483,673 B2 | 1/2009 | Lee | |
| 7,642,747 B2 | 1/2010 | Morioka | |
| 7,812,770 B2 | 10/2010 | Qi | |
| 7,812,771 B2 | 10/2010 | Greene | |
| 7,890,150 B2 | 2/2011 | Lee | |
| 2003/0011478 A1 * | 1/2003 | Rabanne et al. | 340/573.4 |

(Continued)

FOREIGN PATENT DOCUMENTS

| | | |
|---|---|---|
| JP | 2000-049692 | 2/2000 |
| JP | 2001-103149 | 4/2001 |

(Continued)

OTHER PUBLICATIONS

International Search Report issued in PCT/US2012/044275 on Dec. 14, 2012.

(Continued)

*Primary Examiner* — Fekadeselassie Girma
*Assistant Examiner* — Kevin Lau
(74) *Attorney, Agent, or Firm* — DLA Piper LLP (US)

(57) ABSTRACT

Systems and methods relating to integration of circuitry including a transmitter or transceiver component into energy storage devices, such as battery packs for portable electronic equipment. Further embodiments also relate to providing a tuned miniature antenna and/or encapsulating such antenna inside the energy storage device.

12 Claims, 8 Drawing Sheets

(56) References Cited

U.S. PATENT DOCUMENTS

| | | | |
|---|---|---|---|
| 2003/0146835 A1* | 8/2003 | Carter | 340/539.13 |
| 2006/0226996 A1* | 10/2006 | Hisano | 340/586 |
| 2008/0227446 A1 | 9/2008 | Wubker | |
| 2009/0005117 A1 | 1/2009 | Bashan | |
| 2010/0148721 A1 | 6/2010 | Little | |
| 2012/0172083 A1* | 7/2012 | Logalbo et al. | 455/525 |
| 2012/0243686 A1* | 9/2012 | Wesby | 380/270 |

FOREIGN PATENT DOCUMENTS

| | | | |
|---|---|---|---|
| JP | 2007-018470 | | 1/2007 |
| JP | 2007018470 A | * | 1/2007 |
| JP | 2010-277379 | | 12/2010 |
| JP | 2010279065 A | * | 12/2010 |
| TW | 200719123 | | 5/2005 |
| WO | WO 99/53594 | | 10/1999 |

OTHER PUBLICATIONS

English language abstract of JP 2007-018470 published on Jan. 25, 2007.

English language translation of JP 2007-018470 published on Jan. 25, 2007.

English language abstract of JP 2010-277379 published on Dec. 9, 2010.

English language translation of JP 2010-277379 published on Dec. 9, 2010.

English language abstract of JP 2000-049692 published on Feb. 18, 2000.

English language translation of JP 2000-049692 published on Feb. 18, 2000.

English language abstract of JP 2001-103149 published on Apr. 13, 2001.

English language translation of JP 2001-103149 published on Apr. 13, 2001.

Mandal et al., "IntellBatt: The Smart Battery," Computer, Jan. 7, 2010, vol. PP, No. 99, p. 1 [Accessed Feb. 23, 2011—IEEExplore].

"Smart Battery White Paper," Atmel Corporation, 2003, 10 pages, [Accessed Feb. 23, 2011—Google].

English Language Abstract of TW 200719123 published May 16, 2007.

International Preliminary Report on Patentability issued in PCT/US2012/044275 on Oct. 23, 2013.

Response to the Written Opinion in PCT/US2012/044275 dated Apr. 15, 2013.

* cited by examiner

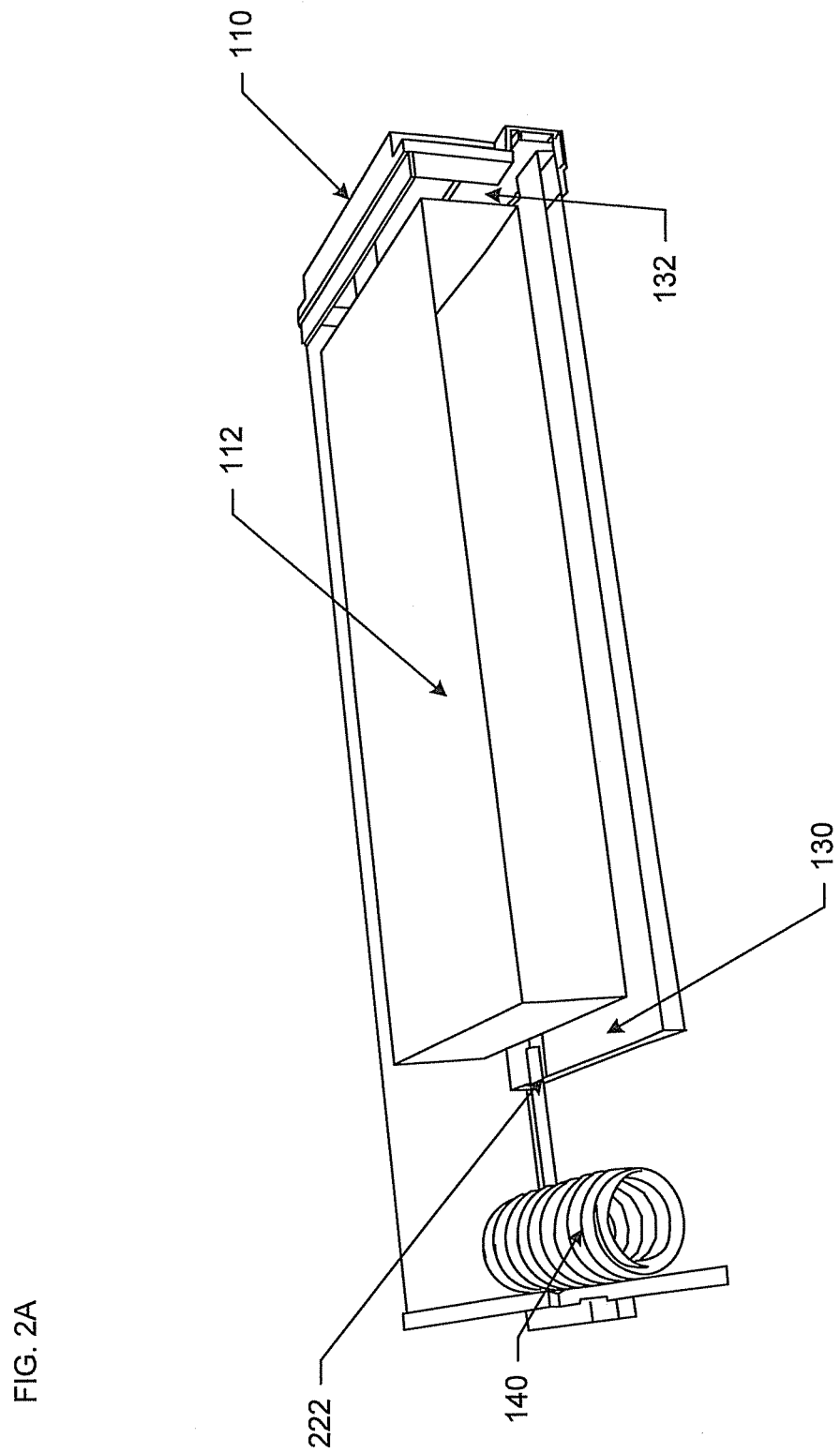

… … …

SYSTEMS AND METHODS OF EMBEDDING A RADIO TRANSCEIVER INTO AN ENERGY STORAGE DEVICE USED IN ELECTRONIC EQUIPMENT

CROSS-REFERENCE TO RELATED APPLICATIONS

This application is based on and derives the benefit of the filing date of U.S. Provisional Patent Application No. 61/503,427, filed Jun. 30, 2011. The entire content of this application is herein incorporated by reference in its entirety.

FIELD

The present disclosure is directed to the field of electronic equipment and, more particularly, towards systems and methods of embedding circuitry and an antenna into an energy storage device associated therewith.

BRIEF DESCRIPTION OF THE FIGURES

FIGS. 2A-2C are schematic representations of cross-sectional views of energy storage devices according to one or more disclosed implementations.

DESCRIPTION OF EMBODIMENTS OF THE INVENTION

Aspects of the present disclosure relate to exploiting the removal of a rechargeable battery or similar energy storage device from an electronic device as a means of activating a locator beacon, transmitter or transceiver packaged inside the energy storage device. According to some embodiments herein, systems and methods for integrating circuitry including a transmitter or transceiver component into energy storage devices, such as battery packs for portable electronic equipment, are disclosed. When the energy storage device is separated from the portable electronic equipment, the transmitter or transceiver inside the energy storage device may transmit a signal, such as a radio frequency signal. This signal may then be detected and the energy storage device located using a multitude of signal detection methods.

Further embodiments herein relate to providing a tuned miniature antenna and/or encapsulating such antenna inside the energy storage device. These embodiments include systems and methods of enclosing a miniature antenna inside a solid encapsulant as a means of robust packaging. Here, for example, some innovations pertain to methods of manufacturing a precision tuned miniature antenna while overcoming the dielectric de-tuning effects introduced by the encapsulation process.

Figure 4:
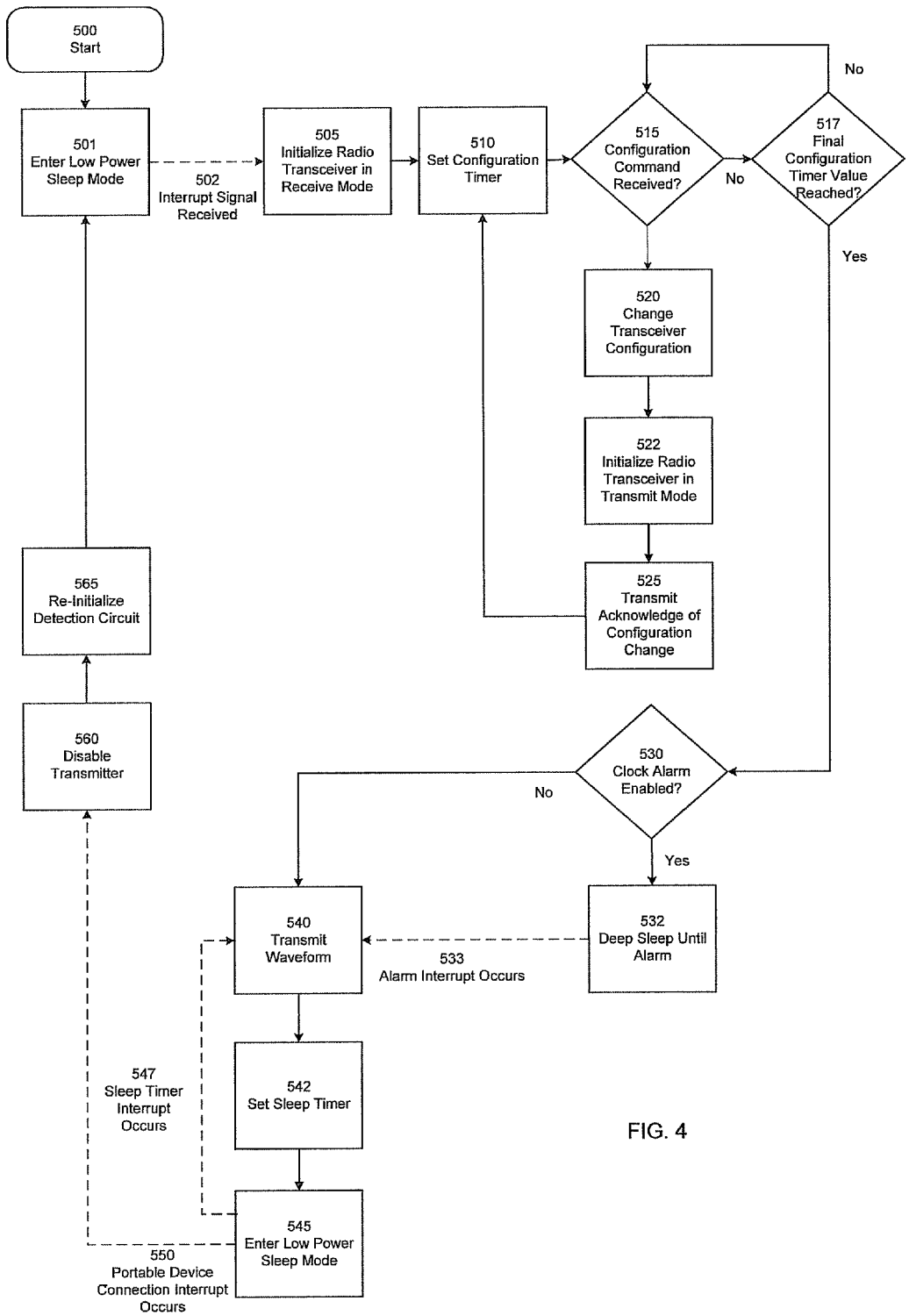
FIG. 4 is a flow chart illustrating exemplary operation of the software residing in the controller according to a disclosed implementation.
Figure 5:
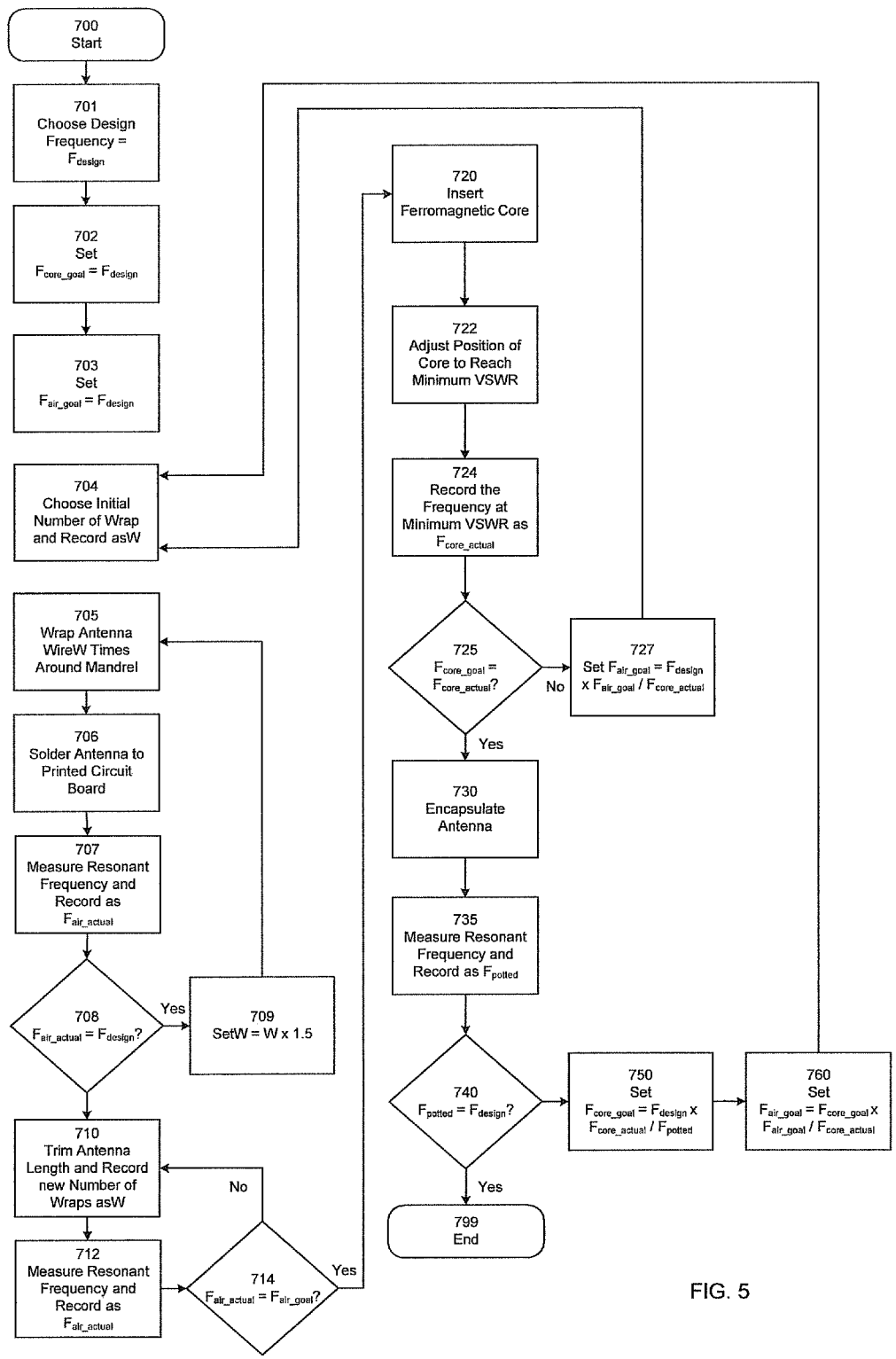
FIG. 5 is a flow chart illustrating an exemplary manufacturing method for producing a precision timed antenna according to a disclosed implementation.

Particular embodiments of the inventions herein will now be discussed with reference to FIGS. 1-5. FIGS. 1A-2C relate to systems and features of radio transceiver components implanted inside the energy storage modules used in portable electronic devices. Of course, the electronic devices need not be portable. FIGS. 4-5 relate to activating/operating transceiver modules within energy storage devices and to processes of tuning and encapsulating miniature radio frequency antennae for use inside such portable electronic devices, respectively.

Figure 1A:
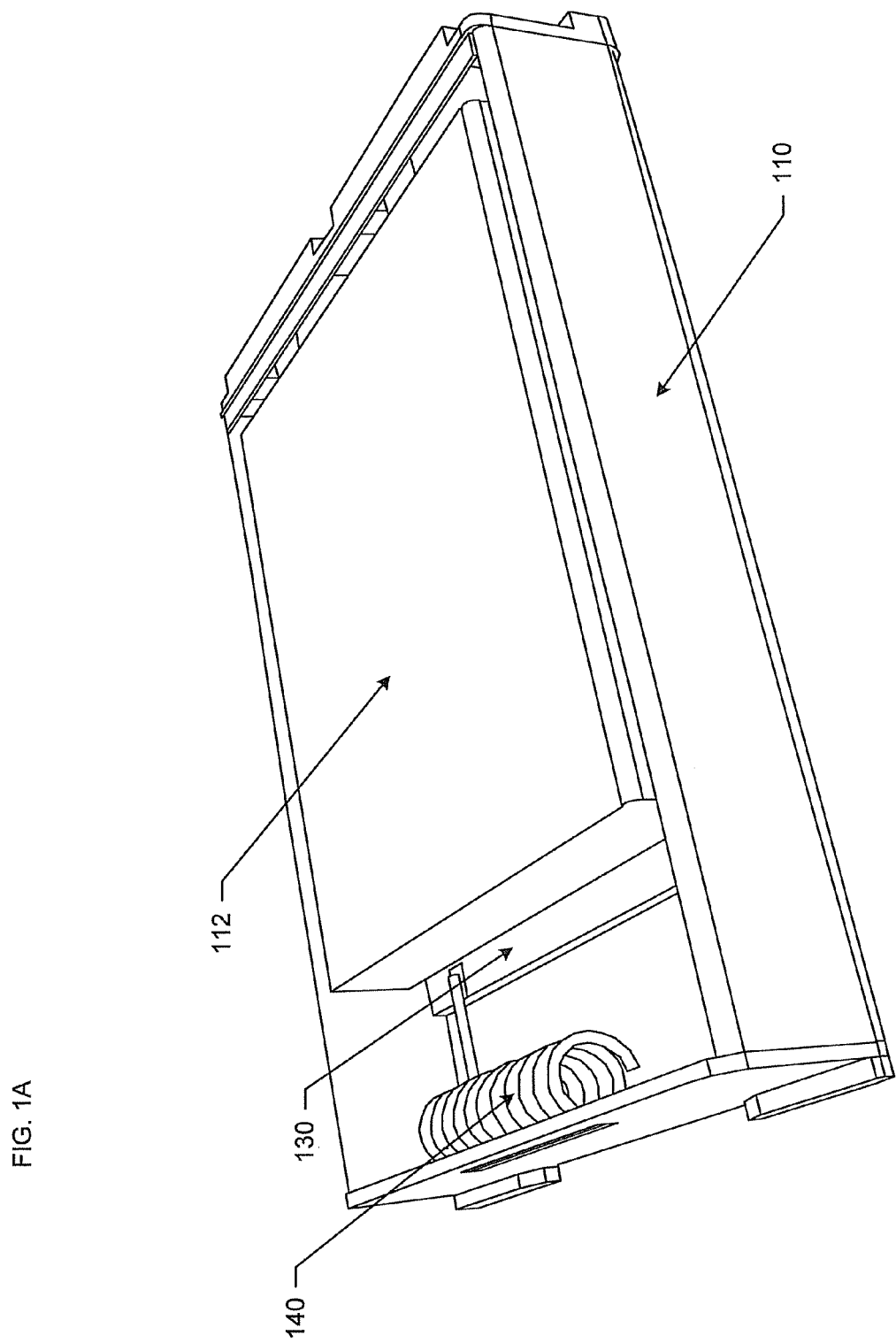
FIGS. 1A and 1B are schematic representations of perspective views of energy storage devices with embedded radio transceivers according to one or more disclosed implementations.
Figure 1B:
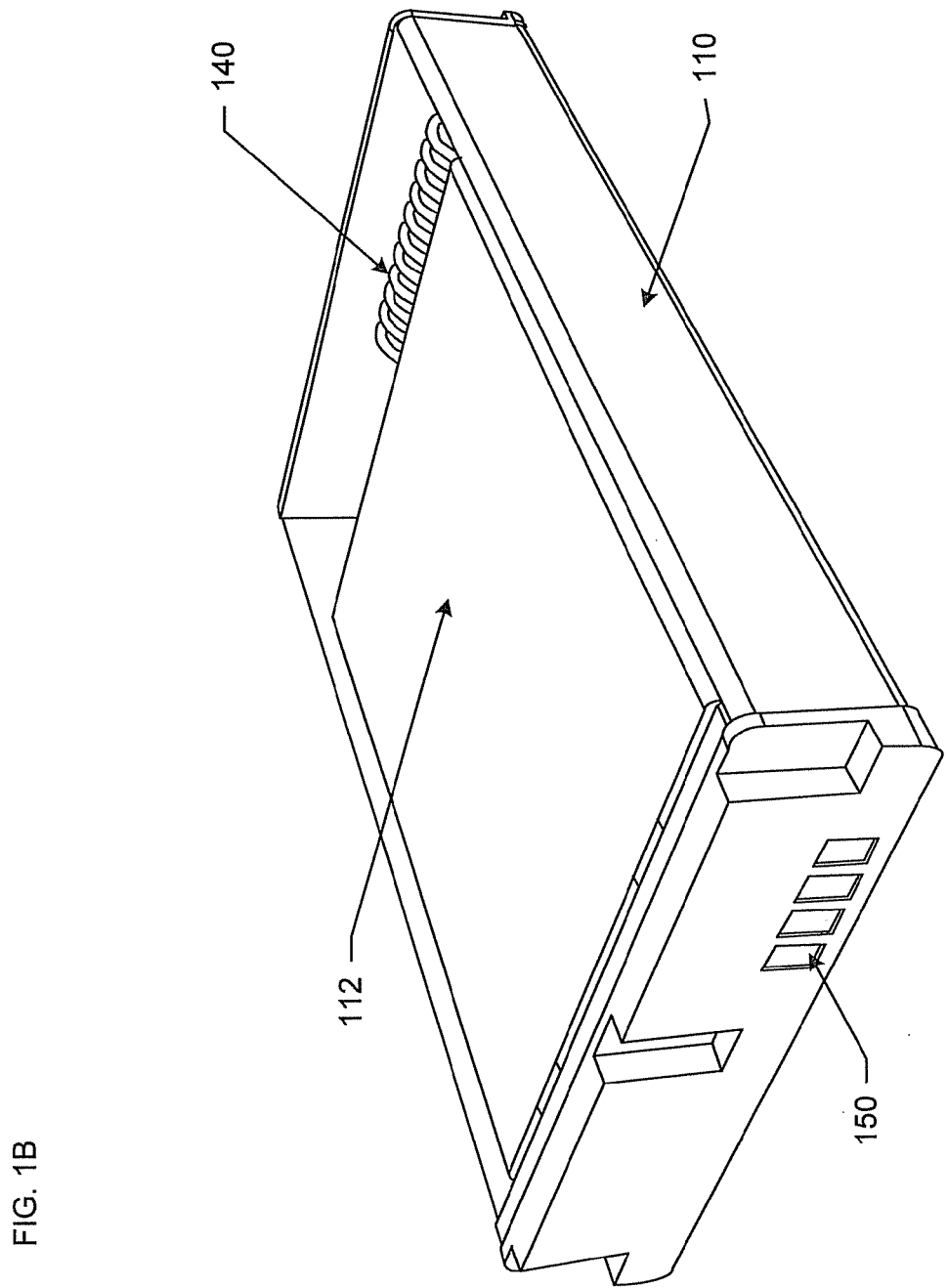

FIGS. 1A and 1B are schematic representations of perspective views of energy storage devices 110 with embedded radio transceivers according to one or more disclosed implementations. Referring to FIG. 1A, a unitary energy storage device and transceiver package 110 within a portable electronic or "host" device 120 is shown. The energy storage device 110 is unitary in that all components of the energy storage device are in a single housing. For example, the energy storage device with transceiver may be packaged to appear as a standard battery for portable electronic equipment. Further, energy storage devices 110 consistent with the innovations herein may include a power supply component such as a battery element 112, and, for example, circuitry such as one or more circuit boards 130, and an antenna 140. As set forth in the drawings and elsewhere below, the energy storage device 110 may be disguised as a conventional battery or battery pack and shaped with the same configuration, appearance and dimensions as the battery element it replaces. FIG. 1B illustrates another perspective view of an energy storage device 110 according to one or more disclosed implementations. FIG. 1B shows the energy storage device 110 and the antenna 140, which may be encapsulated as set forth below, as well as electrical contacts 150 on one or more ends of the energy storage device 110 package, which serve to electrically connect the battery element 112 and associated circuits within the energy storage device to the circuitry of the portable electronic device 120.

Figure 2B:
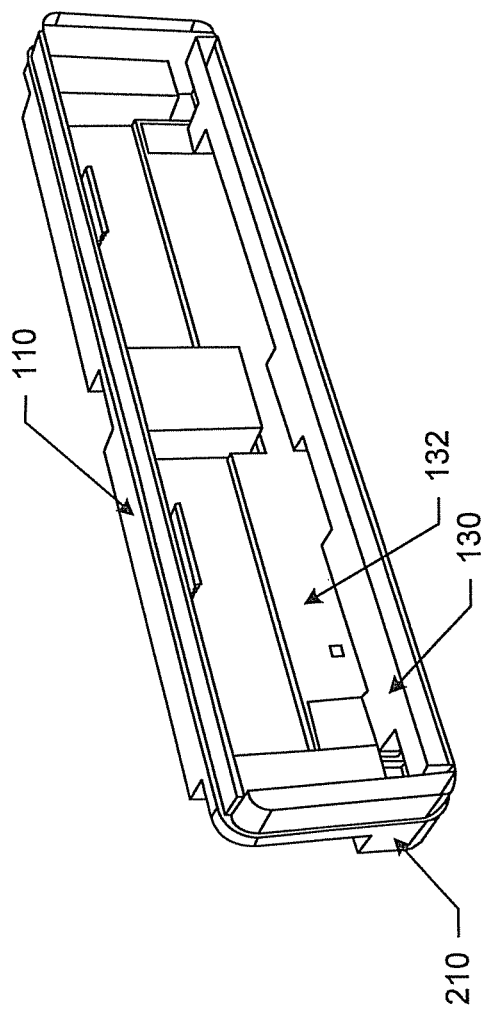
Figure 2C:
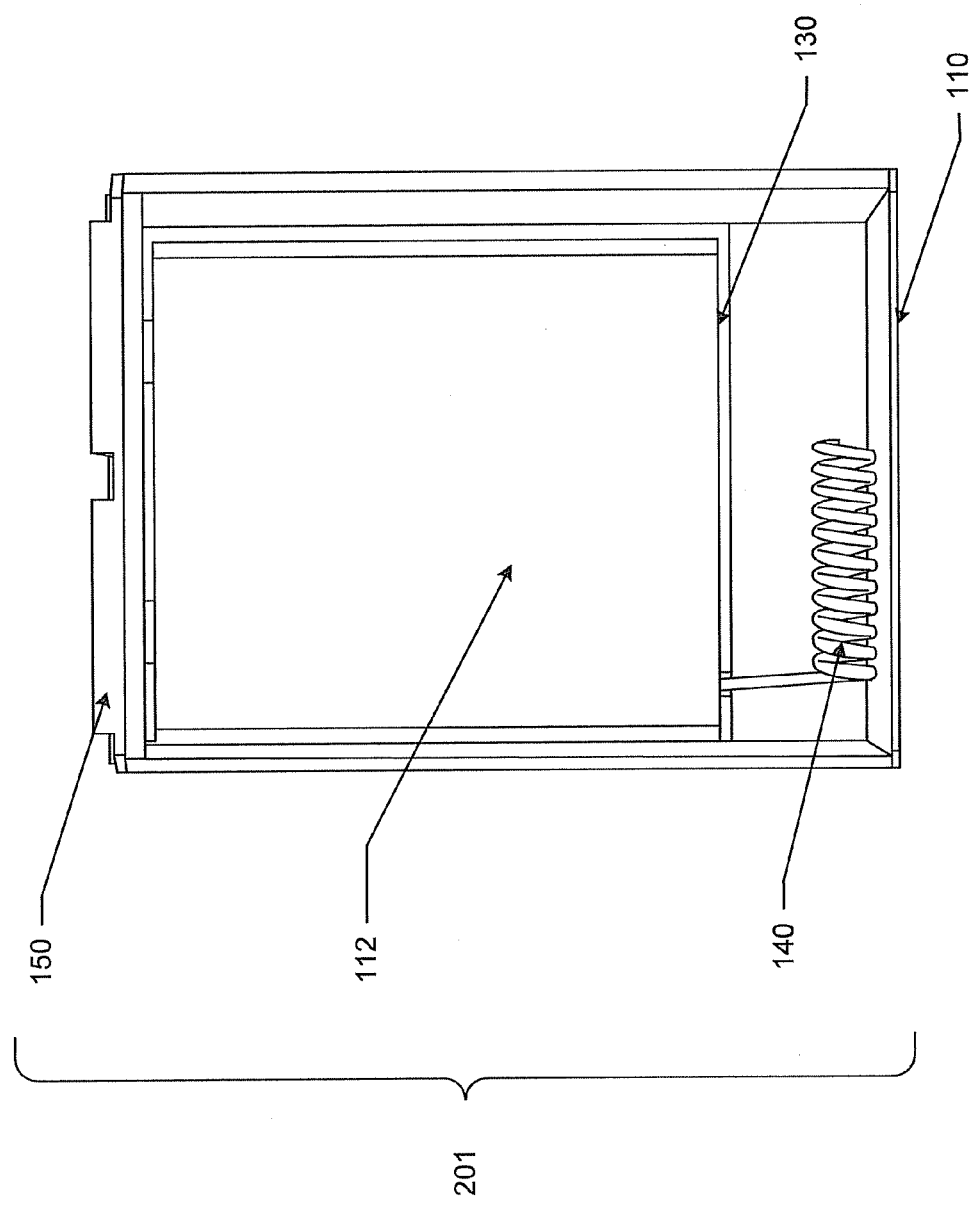

FIGS. 2A-2C are schematic representations of cross-sectional views of energy storage devices according to one or more disclosed implementations. FIG. 2A illustrates a cross-sectional view running down a longitudinal axis of the energy storage device 110, showing an exemplary arrangement of circuit boards 130, 132 within the device 110. The exemplary energy storage device of FIG. 2A may include a battery element 112, circuitry such as circuit boards 130, 132, and an antenna 140 such as an encapsulated, precision-tuned miniature antenna as set forth further below. While circuitry within the energy storage device may be arranged in a variety of configurations, FIG. 2A illustrates one embodiment wherein a first circuit board 132 is positioned in a vertical arrangement and a second circuit board 130 is positioned in a horizontal arrangement, with the term "horizontal," here, referring to the lateral (longer) direction of a conventional, flat battery pack. In the embodiment illustrated, the first circuit board may include, or be located proximate to, the terminals 150 (see FIGS. 1B and 2C) that connect the energy storage device to the external circuits of the associated electronic equipment. Here, for example, the circuit board may include terminals that are located on the opposite side of the PCB and wired through the board. Further, the second circuit board 130 may be positioned in a horizontal arrangement, running underneath or on top of the battery element 112, wherein an end of the second circuit board 130 may have an electrical connection 222 to the antenna 140.

Referring to, FIG. 2B, a cross-sectional view of a front end 210 of the energy storage device 110 package is shown. FIG. 2B illustrates a front region of the energy storage device 110 where the first circuit board 132 may be coupled to the second circuit board 130. As shown in the illustrated embodiment, the first circuit board may be positioned in a vertical arrangement, in much the same way that traditional circuits/circuit boards are provided within true battery packs of this nature. Further, such first circuit board may include the conventional circuitry that is required for the energy storage device 110 to serve as a power supply for the associated electronic equipment 120, such as circuitry for maintaining battery charge level, circuitry used to regulate the power output/voltage, etc. As augmentation to such first circuit board, the second circuit board 130 may be positioned within the energy storage device 110 package in a configuration perpendicular to the first circuit board 132.

FIG. 2C is a cross-sectional top view of an exemplary energy storage device 110 consistent with the innovations herein. FIG. 2C depicts one arrangement of several of the internal energy storage device components, including the battery element 112 and the antenna 140. The top view shown in FIG. 2C shows illustrative positioning of the battery element 112 and the antenna 140 within the energy storage device 110 casing. Collectively, the circuitry utilized to transmit, receive and process information as well as the antenna are referred to as the "transceiver circuitry" 201 for ease of explanation hereafter.

Figure 3:
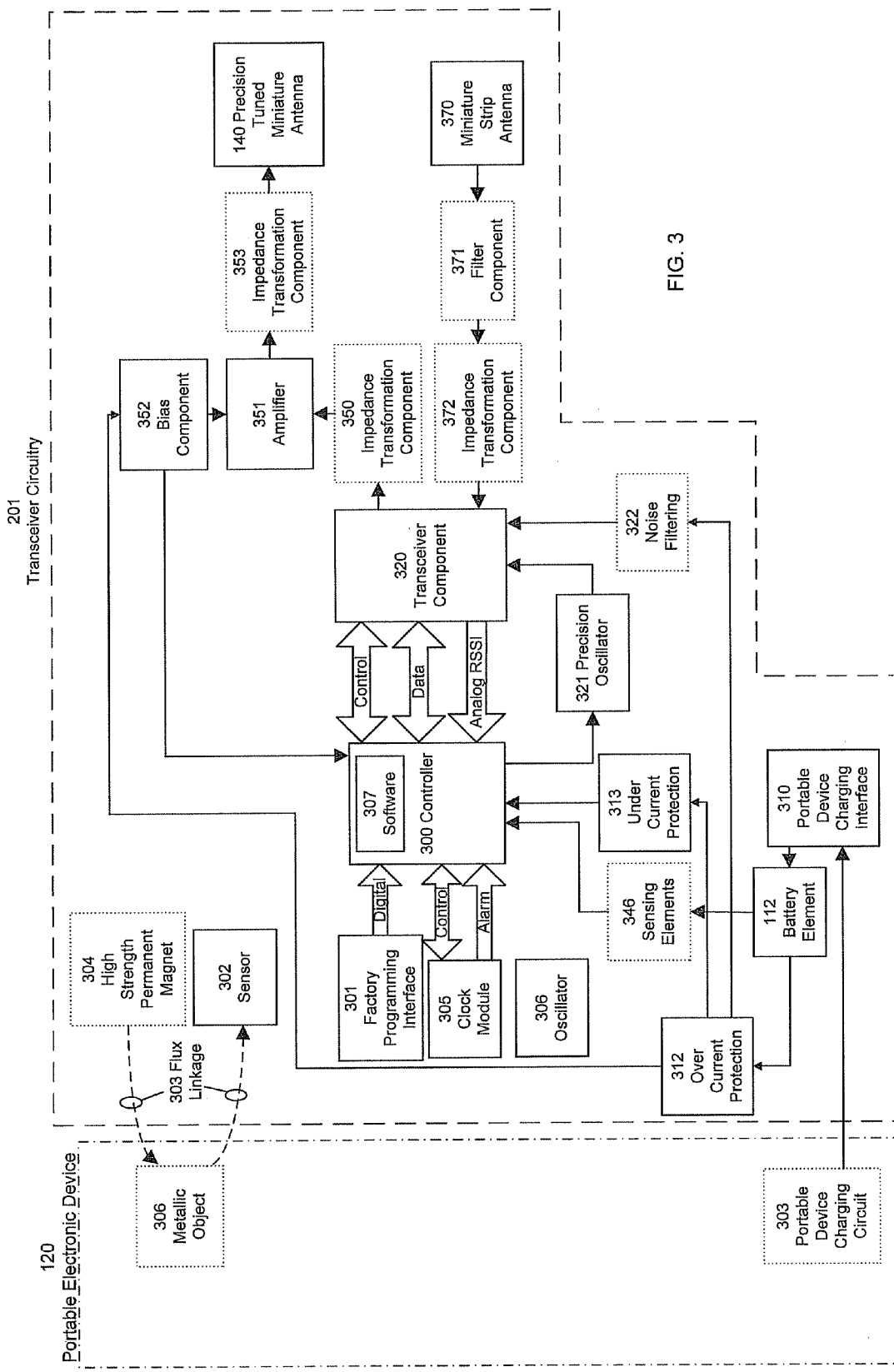
FIG. 3 is a block diagram illustrating exemplary components or modules of a transceiver within an energy storage device and interaction with its portable electronic device according to a disclosed implementation.

FIG. 3 is a block diagram of an exemplary system including transceiver circuitry 201 and its associated portable electronic device host component, consistent with aspects related to the innovations herein. Transceiver circuitry 201 may be located on second circuit board 130, while the antenna 140 may be encapsulated and positioned within the energy storage device packaging. Referring to FIG. 3, various processing modules of the transceiver circuitry 201 as well as interaction with the portable or host device 120 are illustrated. Transceiver circuitry 201 may comprise a plurality of modules or components which provide supporting functionality for the system. For example, the transceiver circuitry 201 may include a portable device charging interface 310 that interfaces with a portable device charging circuit 303 of the portable device 120 to monitor and maintain the energy level of the battery element 112. An over-current protection module 312 may be included to limit the electrical current flow in the system to a predetermined level in order to ensure safe operation of all other modules. An under-voltage protection module 313 may also be included to ensure that the controller 300 does not operate under low voltage conditions that could cause erroneous operation. Here, for example, a low voltage condition could be caused by the depletion of the battery element 112, the failure of a module within the transceiver circuitry 201, the failure of a component within portable electronic device 120, unpredictable changes in the operating environment, or other factors.

In some embodiments, software 307 in controller 300 may be loaded through a factory programming interface 301. Such interface 301 may also; optionally, be configured to update or replace the software 307 and/or to adjust operational parameters stored within the software 307 residing within the controller 300.

According to certain embodiments of the innovations herein, various mechanical or electro-magnetic (EM) related techniques may be used to confirm the presence of the portable electronic device 120. For example, a sensor 302 such as a magnetic field sensor may be included to detect removal or tampering of the energy storage device 110 from within the portable electronic device 120. When the sensor 302 is a magnetic field sensor, for example, such sensor may detect the presence or absence of a metallic object 308 within portable electronic device 120 by way of a change in the flux linkage 303 associated with a high strength permanent magnet 304. In this way, controller 300 is able to infer the presence or absence of portable electronic device 120 from the signal provided to it by the magnetic field sensor. The sensor 302 may also be a sensor that senses a voltage of a battery charge status pin associated with the battery element, and detects a voltage change that results from removal of the energy storage device from the host electronic equipment. Further, in still other embodiments of the invention, the information provided by sensor 302 may be obtained through the use of alternate physical parameters such as light, pressure, force, electrical signals, or other means.

Additionally, other sensing elements 346 may be utilized within the energy storage device to detect various information or parameters, and the sensed information may also be transmitted via the antenna consistent with the innovations herein. Such sensing elements may include, for example, one or more of a GPS receiver/antenna, a microphone and interfacing audio signal circuitry, a temperature sensor, a pressure sensor, an accelerometer, a magnetometer, a light level sensor, as well as other sensors of environmental or physical conditions.

In still further embodiments, a clock module 305 may receive a signal from oscillator 306 and control commands from controller 300. Clock module 305 may set an alarm according to the contents of the control commands from controller 300. Once an alarm is set, the controller 300 may then optionally enter a low power mode to conserve the energy contained in the battery element 112. At the programmed alarm time, clock module 305 provides a signal to controller 300 on an interrupt basis. Upon receiving this interrupt signal from clock module 305, the controller 300 may then resume operation in its normally-powered state.

During one exemplary operation process, the radio transmitter or transceiver 320 receives command signals from controller 300 that specify its operating parameters, which may optionally include carrier frequency, modulation type, data rate, output power level, and/or data symbol mapping, among other parameters. Radio transmitter or transceiver 320 may derive its time base from a precision oscillator 321, which, in turn, may be controlled by the controller 300. Power supplied to radio transmitter or transceiver 320 is optionally conditioned by noise filter 322. In one embodiment, noise filter 322 is supplied power through over current protection module 312. In alternative embodiments, noise filter 322 derives power through or from another module in the system such as under voltage protection module 313, battery element 112, or portable device charging interface 310. In another embodiment, radio transmitter or transceiver 320 is powered directly through or from another module such as under voltage protection module 313, battery element 112, or portable device charging interface 310, whereby noise filter 322 is not implemented.

Circuitry and antennae within energy storage device 110 may be configured to communicate with a variety of communication networks and systems. In some implementations, the radio transmitter or transceiver 320 may be configured for communication with wireless telephony infrastructure of cellular or other personal communication networks, internet access points, existing radio equipment, and other wireless communication systems. For example, radio transmitter or transceiver 320 may communicate with radio signal direction finding equipment, radio signal geo-location equipment, or other radio signal detection and processing equipment. Such radio transmitter or transceiver 320 may be part of a communication component and, in one embodiment, may be a transmitter that is configured to transmit periodic distress signals to enable determining location of the energy storage device without including a receiver.

Upon activation and based upon commands received from controller 300, radio transceiver 320 generates a radio frequency signal. In various embodiments, the output of the radio transceiver 320 may be modulated to convey data such as a unique identifier; geographic location; altitude; situational data such as temperature, air pressure, ambient light intensity, or spatial orientation; movement data such as velocity, acceleration, or bearing; incremental message identifiers, and/or other optional data.

The modulation of the signal transmitted by radio transceiver 320 may be realized through one, or multiple, modulation schemes including, but not limited to, frequency shift keying, minimum shift keying, amplitude shift keying, on-off keying, phase shift keying, quadrature phase shift keying, or another optional modulation scheme. Optionally, the signal transmitted by radio transceiver 320 may be a continuous wave with no modulation, or with simple energy-saving duty cycle schedules.

Further, the signal generated by radio transceiver 320 may pass through impedance transformation component 350, such as an impedance transformation network, where it is optionally conditioned before entering amplifier 351. A bias component 352 may also be included to provide power to amplifier 351 by way of a control signal from controller 300. In one embodiment, for example, over current protection module 312 may provide power directly to bias component 352. In alternative embodiments, the bias component 352 may derive its power from another module such as under voltage protection module 313, battery element 112, or portable device charging interface 310.

The signal amplified by amplifier 351 may also, optionally, be conditioned, such as via another impedance transformation component 353, before entering precision tuned miniature antenna 140. The electronic components contained within impedance transformation network 353 and the precision tuned miniature antenna 140 may be optionally adjusted before, during, and after the manufacturing process to alter the effective radiated power of transceiver circuitry 201. One possible process for adjusting these components is described below and especially in connection with FIG. 5.

Radio energy impinging energy storage device 110 for processing via the transceiver circuitry 201 may be collected by a miniature strip antenna 370. Received signals may then be transmitted to an optional filtering component 371, such as a filter network, included between the antenna 370 and the radio transceiver 320, e.g., to block out-of-band signals. In one embodiment, the filtering component 371 may be a high pass filter. In alternative embodiments, the filtering component 371 may be implemented as a low pass filter, a band pass filter, a band block filter, or any other filter topology. Radio energy from the miniature strip antenna 370 may also be conditioned, such as via another impedance transformation component 372, before entering the transceiver component 320.

Radio frequency signals entering the radio transceiver component 320 may be modulated by one, or multiple, modulation schemes including, but not limited to, frequency shift keying, minimum shift keying, amplitude shift keying, on-off keying, phase shift keying, quadrature phase shift keying, or another optional modulation scheme. Here, for example, the transceiver component 320 may demodulate any data present in the radio frequency signals and transmit the data to controller 300 for interpretation, e.g., via software 307. In one embodiment, receive signal strength information may optionally be provided by the transceiver component 320 to controller 300 for interpretation by software 307.

The innovations herein may also be embodied within circuitry, such as one or more components, that are configured to carry out the features and functionality set forth herein. In one such implementation, the innovations may be embodied in a component or board designed for later integration, e.g., by a third party, into an energy storage device. Thus, here, the innovations may comprise a component, configured for integration within an energy storage device having a battery element, that determines whether the energy storage device has been removed from a host piece of electronic equipment. Further, such component may comprise detection circuitry that senses a voltage of a battery charge status pin associated with the battery element and detects a voltage change that results from removal of the energy storage device from the host electronic equipment, and logic circuitry configured to confirms removal of the energy storage device from the host electronic equipment and/or transmit a signal indicating that the energy storage device has been removed from the host electronic equipment.

The electronic device may be a personal electronic device including laptops, tablets, PDAs (personal data assistants), smart phones, such as cellphones, or other electronic devices typically carried by users. In situations where the holder of an electronic device has been kidnapped or otherwise lost, it has been known to use signals from the device to locate the holder of the device. Those who perpetrate kidnapping have become familiar with such techniques. To overcome this locating technique, those who perpetrate kidnappings have been known to remove the battery pack of the device to prevent the device from transmitting any signals. The energy storage device 110 can be employed to defeat this strategy in that, when energy storage device 110 is removed from a cellphone or other electronic device 120, transceiver circuitry 201 can transmit and its signal can be employed to locate energy storage device 110.

FIG. 4 is a flow diagram illustrating operation of exemplary software residing in the controller, according to a disclosed implementation. Referring to FIG. 4, a software flow chart describing illustrative activation and/or operation processes is disclosed, such as those related to the removal of the energy storage device 110 from portable electronic device 120. When energy storage device 110 is positioned within portable electronic device 120, at 501, the controller 300 may be in a low-power sleep mode in order to conserve the energy contained within the battery element 112 of energy storage device 110. The controller 300 may then remain in this low-power sleep state until receipt of an interrupt signal at 502, which may be derived, e.g., from sensor 302 upon removal of the energy storage device 110 from the electronic device, as set forth above. In addition to the magnetic sensor described above, the sensor 302 may be a sensor reactive to physical parameters such as light, pressure, force, electrical signals, or alternate stimuli, all of which may cause initiation of an interrupt signal. Interrupt signals, here, may initialize the transceiver into a variety of desired configurations, such as transmitting an initial alert, sending beacons and/or transmission at set intervals, awaiting instructions, establishing standby and/or delay parameters, and entering other interactive states or conditions as a function of communication with a monitoring or control system, among others.

Turning to the illustrative process shown in FIG. 4, upon receipt of the interrupt at 502, the software may initialize the transceiver in a receive mode 505. Here, the transceiver may enter a receive mode where it begins to process signals from the antenna, e.g., awaiting first configuration instructions from the monitoring or control system. Next, at 510, a configuration timer may be set. Here, for example, the energy storage device may be programmed to await configuration instructions from the monitoring system for a set period of time. This timed configuration loop may enable the energy storage device to ensure that all configuration instructions have been received, and/or direct all processing power towards receiving important configuration commands, etc. Then, at 515, it is determined if a configuration command has been received. Here, for example, a configuration command may be received and processed from the monitoring system, such as from an external tracking platform that initiates a configuration change, or from other external wireless devices within the operating environment. If no configuration command is received over the configuration period, the software may confirm, at 517, whether or not the final configuration timer value has been reached. If, at 517, if the configuration timer has not reached the final value (as set at 510), then the software loops back to continue the process of determining whether or not any configuration commands are received, at 515. This process continues until either a configuration command is received, at 515, or the final configuration timer value is reached, at 517.

If, at 515, a configuration command is received, the software initiates a second loop, beginning at 520. Upon determining that a configuration command has been received, the controller 300 first, at 520, configures the transceiver according to the parameters of the received command. Here, the transceiver may be configured to transmit at one or more specified frequencies, at certain times, for certain durations, etc. For example, configuration information received, here, may include the frequency information and allocations for the transmitted or received signals, timing information related to transmissions including on/off cycles, identification information, modulation information, as well as various payload information, among other data. Further, control of the clock alarm enable features discussed further below, such as setting or adjusting clock alarm timing, may also be received and processed via this configuration process. Then, at 522, the controller 300 initializes the radio transceiver component 320 in transmit mode. Next, at 525, the radio transceiver component 320 transmits a data packet acknowledging that the configuration parameters received at 515 were applied. Finally, the software then returns back to the configuration process, at 510, to determine if any further configuration commands are received over the remainder of the configuration time period.

If, at 517, the confirmation timer has achieved its final value, the software may proceed to an optional clock alarm enable step 530. At 530, the software determines whether or not a clock alarm hold condition is enabled. This condition and step may allow the energy storage device to enter a deep sleep state to conserve power in situations where an immediate transmission of a signal or waveform is not desired, such as within a set period of time from a few seconds to any number of days. Here, for example, the energy storage device may be configured to wait a certain time period before commencing the alarm transmission sequence. This feature can be utilized to determine if such transmission is truly needed, for example, such as providing sufficient time for the energy storage device to be reinserted into the electronic equipment. This is useful for devices where users may remove battery packs to check, replace or utilize data stored on memory storage cards within the equipment that are stored under the battery pack. If the clock alarm hold condition is enabled, the software proceeds on a first branch, to 532, wherein the energy storage device enters a deep sleep state to conserve power until an interrupt signal to release the alarm hold is received. Here, the energy storage device and software are configured to remain in the sleep mode 532 until the clock module generates such alarm interrupt 533. Upon receipt of this interrupt 533, the software may then proceed to a transmission sequence at 540. If, at 530, the clock alarm has not been enabled, the software proceeds directly to the transmit waveform sequence, at 540.

Upon receipt of the alarm interrupt or if the clock alarm state has not been set, the radio transceiver 320 will then transmit, at 540, the appropriate alert waveform. The various parameters of this waveform, such as time, duration, frequency, etc., may be set according to parameters received via the configuration process 510-517. After such transmission, an appropriate sleep timer may then be set, at 542. Here, for example, the software and energy storage device may be configured to enter an inactive or dormant state until the next interrupt is received, e.g., from the clock module 305. With the sleep timer set, the controller then enters a low-power sleep mode 545 in order to conserve the energy contained in energy storage device 110. Upon receipt of a sleep timer interrupt 547 during this sleep mode, the software returns to the next transmit waveform operation 540.

The energy storage device may also be configured to detect that connection to the portable electronic device has been reestablished, such as when a battery pack is reinserted. This is illustrated in FIG. 4 at 550, which shows receipt of a portable device connection interrupt when a reconnection condition is detected. Here, the software will then proceed to operations of disabling the radio transmitter 560, and re-initializing the detection circuit 565, such as resetting the magnetic field sensor described above. If, at 560, an alternate parameter such as light, pressure, force, electrical signals, or other means is used, then of course the operation of re-initializing any such alternate sensor is performed at 565.

FIG. 5 is a flow chart describing an exemplary manufacturing process used to produce precision tuned antenna 140. To begin, a designer may first select 701 a desired frequency, $F_{design}$, at which the antenna is designed to operate. Here, in one exemplary embodiment, $F_{design}$ may be selected to correspond to the transmission frequency used at 540, described above. In other embodiments, $F_{design}$ may be selected as an alternate desired frequency.

Next, one or more operations of an initialization process may be performed before proceeding with the iterative processes set forth further below. For example, as a first step of such initialization process 702, the frequency to which the antenna should be tuned (i.e., for operation with a magnetic core inserted), $F_{core\_goal}$, may initially be set equal to $F_{design}$. Additionally, as a second step of such initialization process 703, the frequency to which the antenna should be tuned to operate with no magnetic core inserted, $F_{air\_goal}$, may also initially be set equal to $F_{design}$.

After these parameters are set, various iterative processes may be utilized, beginning with the test coil wound with a hollow air core, to produce an antenna that will operate at the desired frequency in an encapsulated state. At 704 of such iterative processes, the initial number of wraps of wire to be used for the antenna may be selected, here denoted as W. Next, in an initial winding operation 705, the antenna wire is wrapped around a mandrel having a diameter equal to the desired magnetic core, W times. By way of illustration, a wrap quantity, W, might be selected to equal an initial value of 20. Of course, in practice, the starting quantity of W may be selected as having other initial value(s). Next, as part of an electrical testing/coupling operation 706, the antenna may be affixed and/or electrically connected to a test fixture. For example, the antenna may be soldered to a test fixture, to which an adapter may also be attached for connection with the required test equipment.

Next, in a measurement operation 707, the resonant frequency of the antenna with air core (referred to herein as $F_{air\_actual}$) may be measured. Following measurement, a comparison operation 708 may be performed to determine whether $F_{air\_actual}$ is greater than $F_{design}$. If $F_{air\_actual}$ is greater than $F_{design}$, a loop procedure is initiated to increment the quantity of windings and then perform the measuring 707 and comparing 708 operations again. In the exemplary loop procedure shown in FIG. 5, the quantity of windings, W, is incremented by a multiplier/factor of 1.5, with the resulting coil then being mounted/soldered 706, measured 707 and compared 708. Of course, other multipliers may be used.

Once the measured resonant frequency, $F_{air\_actual}$, is confirmed at 708 to be equal to or greater than the design frequency, $F_{design}$, an iterative process of adjusting the frequency by trimming smaller wire lengths from the coil is performed. Here, for example, in one exemplary trimming operation 710, approximately one tenth of one wrap of wire may be removed from the antenna structure. Next, at 712, the resonant frequency of the antenna is again measured with the test equipment, with this value being used to replace the value of $F_{air\_actual}$. Another comparison operation 714 may then be performed, wherein a determination is made as to whether the new value of $F_{air\_actual}$ is equal to $F_{air\_goal}$. While the term equal is used throughout this disclosure, values with some slight variance may also be deemed "equal" as this term is to be understood herein. If this comparison operation 714 reveals that $F_{air\_actual}$ is not equal to $F_{air\_goal}$, then this branch of the iterative process returns to 710, where another length of an antenna winding is removed prior to repeating the measurement 712 and comparison 714.

When the antenna windings have been trimmed appropriately such that $F_{air\_actual}$ is equal to $F_{air\_goal}$, the magnetic core is then inserted into the antenna at 720. Then, at 722, the position of the magnetic core is adjusted in order to obtain the minimum possible voltage standing wave ratio (VSWR) on the test equipment. Next, at 724, the frequency at which this minimum voltage standing wave ratio occurs is recorded as $F_{core\_actual}$.

Following this recordation of VSWR, another comparison may be performed, comparing $F_{core\_goal}$ with $F_{core\_actual}$ 725. Here, for example, if $F_{core\_goal}$ is indeed equal to $F_{core\_actual}$, the antenna fabrication process proceeds to encapsulating the antenna, at 730, described in more detail below. If, however, $F_{core\_goal}$ is not equal to $F_{core\_actual}$, the process proceeds to adjusting $F_{air\_goal}$, at 727. Here, the value of $F_{air\_goal}$ is adjusted using a replacement value calculated as the product of $F_{design}$ and the ratio of $F_{air\_goal}$ divided by $F_{core\_actual}$:

$$F_{air\_goal} = F_{design} \times F_{air\_goal} / F_{air\_actual} \quad \{Equation\ 1\}$$

With this revised value of $F_{air\_goal}$ in place, the antenna fabrication process returns to the iterative processes of winding, measuring and trimming the coil as well as inserting the core (i.e., at 705-725), until a value of $F_{core\_actual}$ equal to $F_{core\_goal}$ is achieved and the encapsulation phase (at 730+) can commence.

Once $F_{core\_actual}$ is equal to $F_{core\_goal}$, a process of encapsulating the antenna at 730 may be performed, in which the antenna is encapsulated with the desired potting compound. Following encapsulation, another measurement process may be performed at 735, wherein the potted antenna is measured with the test equipment and the resonant frequency is recorded as $F_{potted}$. Then, another comparison is performed at 740, to determine whether or not $F_{potted}$ equal to $F_{design}$. If $F_{potted}$ is found to be equal to $F_{design}$, a working/correct antenna design has been achieved, and the successful design process may now end, at 799.

If, however, $F_{potted}$ is determined as not equal to $F_{design}$ via comparison 740, revised values of $F_{core\_goal}$ and $F_{air\_goal}$ are calculated at 750 and 760, respectively, before returning back to the iterative processes associated with winding, measuring, and trimming the coil as well as inserting the core (i.e., at 705-725). At 750, the value of $F_{core\_goal}$ is replaced with the value calculated as the product of $F_{design}$ multiplied by the ratio of $F_{core\_actual}$ divided by $F_{potted}$:

$$F_{core\_goal} = F_{design} \times F_{core\_actual} / F_{potted} \quad \{Equation\ \#2\}$$

Additionally, at 760, the value of $F_{air\_goal}$ is replaced with the value calculated as the product of $F_{core\_goal}$ multiplied by the ratio of $F_{air\_goal}$ divided by $F_{core\_actual}$:

$$F_{air\_goal} = F_{core\_goal} \times F_{air\_goal} / F_{core\_actual} \quad \{Equation\ \#3\}$$

With these revised values in place, the overall antenna design process returns to winding at 704, to begin the iterative processes at 705-725 with these revised values.

It will be apparent to those of skill in the art that numerous variations in addition to those discussed above are also possible. Therefore, while the invention has been described with respect to certain specific embodiments, it will be appreciated that many modifications and changes may be made by those skilled in the art without departing from the spirit of the invention. It is intended therefore, by the appended claims to cover all such modifications and changes as fall within the true spirit and scope of the invention.

Furthermore, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

The invention claimed is:

1. A method for locating an energy storage device that has been removed from an associated electronic equipment, the method comprising:
   providing an encapsulated, tuned miniature antenna within the energy storage device;
   detecting whether an energy storage device has been removed from a host electronic equipment; and
   transmitting a signal from a transmitter integrated with the energy storage device in a unitary package indicating that the energy storage device has been removed from the host electronic equipment;
   wherein the antenna comprises a coil and design parameters including a potted frequency ($F_{potted}$) being equal to a design frequency ($F_{design}$) and is fabricated via a process wherein an air frequency ($F_{air\_goal}$) and a core frequency ($F_{core\_goal}$) for the coil are set to the design frequency, the process including:
   (i) positioning a ferromagnetic core inside the coil, the coil having coil windings yielding a resonant frequency in air ($F_{air\_actual}$) equal to a desired coil frequency ($F_{air\_goal}$), wherein the ferromagnetic core is positioned to achieve a minimum voltage standing wave ratio (VSWR) value corresponding to an actual core frequency ($F_{core\_actual}$) of the coil;
   (ii) determining if the desired core frequency is equal to the actual core frequency and, if not, repeating step (ii) with a revised air frequency given by $F_{air\_goal}=F_{design} \times F_{air\_goal}/F_{air\_actual}$ until the desired core frequency is equal to the actual core frequency;

(iii) encapsulating the coil to yield an antenna;

(iv) measuring a resonant frequency of the encapsulated coil; and (v) determining if the resonant frequency of the encapsulated coil is equal to the design frequency and, if not, repeating steps (i)-(iii) using a revised core frequency given by $F_{core\_goal}=F_{design} \times F_{core\_actual}/F_{potted}$ as well as revised air frequency given by $F_{air\_goal}=F_{core\_goal} \times F_{air\_goal}/F_{core\_actual}$ until the potted frequency equals the desired design frequency, to yield the design parameters.

2. The method of claim 1, further comprising the energy storage device receiving signals.

3. The method of claim 2 wherein the transmitter is configured to communicate with an external component wirelessly.

4. The method of claim 1 wherein the transmitter transmits periodic distress signals to enable determining location of the energy storage device without including a receiver.

5. The method of claim 1 wherein the transmitter transmits communications regarding operation condition(s) of the energy storage device and a distress beacon.

6. The method of claim 1 further comprising transmitting and receiving communications regarding operation condition(s) of the energy storage device and transmitting a distress beacon.

7. A method for locating an energy storage device that has been removed from an associated host electronic equipment, the method comprising:

providing an encapsulated, tuned miniature antenna within the energy storage device;

sensing a signal from a detector that detects presence of the energy storage device within the host electronic equipment;

detecting a signal change that results from removal of the energy storage device from the host electronic equipment; and transmitting a signal, via the antenna, when the energy storage device has been removed from the host electronic equipment;

wherein the antenna comprises a coil and design parameters including a potted frequency ($F_{potted}$) being equal to a design frequency ($F_{design}$) and is fabricated via a process wherein an air frequency ($F_{air\_goal}$) and a core frequency ($F_{core\_goal}$) for the coil are set to the design frequency, the process including:

(i) positioning a ferromagnetic core inside the coil, the coil having coil windings yielding a resonant frequency in air ($F_{air\_actual}$) equal to a desired coil frequency ($F_{air\_goal}$), wherein the ferromagnetic core is positioned to achieve a minimum voltage standing wave ratio (VSWR) value corresponding to an actual core frequency ($F_{core\_actual}$) of the coil;

(ii) determining if the desired core frequency is equal to the actual core frequency and, if not, repeating step (ii) with a revised air frequency given by $F_{air\_goal}=F_{design} \times F_{air\_goal}/F_{air\_actual}$ until the desired core frequency is equal to the actual core frequency;

(iii) encapsulating the coil to yield an antenna;

(iv) measuring a resonant frequency of the encapsulated coil; and (v) determining if the resonant frequency of the encapsulated coil is equal to the design frequency and, if not, repeating steps (i)-(iii) using a revised core frequency given by $F_{core\_goal}=F_{design} \times F_{core\_actual}/F_{potted}$ as well as revised air frequency given by $F_{air\_goal}=F_{core\_goal} \times F_{air\_goal}/F_{core\_actual}$ until the potted frequency equals the desired design frequency, to yield the design parameters.

8. The of claim 7 further comprising collecting information regarding the energy storage device, and transmitting the collected information.

9. The energy storage device of claim 8 wherein the antenna is configured to communicate with an external component wirelessly.

10. The energy storage component of claim 9 wherein the energy storage device includes a transceiver that is configured to receive signals.

11. The energy storage device of claim 10 further comprising transmitting periodic distress signals to enable determining location of the energy storage device.

12. A method for determining if an energy storage device has been removed from a host electronic equipment, the method comprising:

providing an encapsulated, tuned miniature antenna within the energy storage device;

sensing, via circuitry within a unitary package of the energy storage device, a signal from a sensor that detects presence of the energy storage device within the host electronic equipment;

detecting a signal change that results from removal of the energy storage device from the host electronic equipment; and providing, via the antenna, an indication that the energy storage device has been removed from the host electronic equipment, wherein the antenna comprises a coil and design parameters including a potted frequency ($F_{potted}$) being equal to a design frequency ($F_{design}$) and is fabricated via a process wherein an air frequency ($F_{air\_goal}$) and a core frequency ($F_{core\_goal}$) for the coil are set to the design frequency, the process including:

(i) positioning a ferromagnetic core inside the coil, the coil having coil windings yielding a resonant frequency in air ($F_{air\_actual}$) equal to a desired coil frequency ($F_{air\_goal}$), wherein the ferromagnetic core is positioned to achieve a minimum voltage standing wave ratio (VSWR) value corresponding to an actual core frequency ($F_{core\_actual}$) of the coil;

(ii) determining if the desired core frequency is equal to the actual core frequency and, if not, repeating step (ii) with a revised air frequency given by $F_{air\_goal}=F_{design} \times F_{air\_goal}/F_{air\_actual}$ until the desired core frequency is equal to the actual core frequency;

(iii) encapsulating the coil to yield an antenna;

(iv) measuring a resonant frequency of the encapsulated coil; and (v) determining if the resonant frequency of the encapsulated coil is equal to the design frequency and, if not, repeating steps (i)-(iii) using a revised core frequency given by $F_{core\_goal}=F_{design} \times F_{core\_actual}/F_{potted}$ as well as revised air frequency given by $F_{air\_goal}=F_{core\_goal} \times F_{air\_goal}/F_{core\_actual}$ until the potted frequency equals the desired design frequency, to yield the design parameters.

* * * * *